(12) United States Patent
Takagi (10) Patent No.: US 8,026,595 B2
(45) Date of Patent: Sep. 27, 2011

(54) SEMICONDUCTOR DEVICE HAVING HERMITICALLY SEALED ACTIVE AREA AND ELECTRODES

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/270,367

(22) Filed: Nov. 13, 2008

(65) Prior Publication Data

US 2009/0189200 A1 Jul. 30, 2009

(30) Foreign Application Priority Data

Jan. 24, 2008 (JP) ................................. 2008-013721

(51) Int. Cl.
*H01L 29/66* (2006.01)
(52) U.S. Cl. . 257/704; 257/710; 257/724; 257/E21.499; 257/E21.5; 257/E21.501; 257/E23.128; 257/E23.193; 438/126; 438/422; 438/456
(58) Field of Classification Search .................. 257/259, 257/E29.317, E21.145, E21.505, 704, 710, 257/424; 438/126
See application file for complete search history.

(56) References Cited

U.S. PATENT DOCUMENTS

| | | | | |
|---|---|---|---|---|
| 6,020,613 | A * | 2/2000 | Udomoto et al. | 257/341 |
| 2004/0021156 | A1* | 2/2004 | Asano et al. | 257/222 |
| 2004/0048463 | A1 | 3/2004 | Haematsu | |
| 2009/0001553 | A1* | 1/2009 | Pahl et al. | 257/704 |

FOREIGN PATENT DOCUMENTS

| | | |
|---|---|---|
| DE | 195 22 364 C1 | 7/1996 |
| DE | 198 23 069 A1 | 4/1999 |
| EP | 1 198 006 A2 | 4/2002 |
| EP | 1 363 331 A2 | 11/2003 |
| JP | 1-283852 | 11/1989 |

(Continued)

OTHER PUBLICATIONS

U.S. Appl. No. 12/351,318, filed Jan. 9, 2009, Yamamura.

(Continued)

*Primary Examiner* — Benjamin Sandvik
*Assistant Examiner* — Farid Khan
(74) *Attorney, Agent, or Firm* — Oblon, Spivak, McClelland, Maier & Neustadt, L.L.P.

(57) ABSTRACT

A semiconductor device and a fabrication method of the semiconductor device, the semiconductor device including: a gate electrode, a source electrode, and a drain electrode which are placed on a first surface of a substrate, and have a plurality of fingers; a gate terminal electrode, a source terminal electrode, and the drain terminal electrode which governed and formed a plurality of fingers for every the gate electrode, the source electrode, and the drain electrode; an active area placed on an underneath part of the gate electrode, the source electrode, and the drain electrode, on the substrate between the gate electrode and source electrode, and on the substrate between the gate electrode and the drain electrode; a sealing layer which is placed on the active area, the gate electrode, the source electrode, and the drain electrode through a cavity part, and performs a hermetic seal of the active area, the gate electrode, the source electrode, and the drain electrode. Accordingly, the semiconductor element itself can have airtightness, it is not necessary to cover the gate electrode surface with a damp-proof protective film, gate capacitance of the semiconductor element is reduced, and high frequency characteristics and gain of the semiconductor element improve.

8 Claims, 10 Drawing Sheets

FOREIGN PATENT DOCUMENTS

| | | |
|---|---|---|
| JP | 2-288409 | 11/1990 |
| JP | 5-335343 | 12/1993 |
| JP | 11-354540 | 12/1999 |
| JP | 2001-28425 | 1/2001 |
| JP | 2002-368014 | 12/2002 |
| JP | 2004-6816 | 1/2004 |
| JP | 2004-95637 | 3/2004 |
| JP | 2006-43847 | 2/2006 |
| JP | 2006-156902 | 6/2006 |
| JP | 2007-36829 | 2/2007 |
| WO | WO 2006/077565 * 7/2006 | ................. 438/126 |
| WO | WO 2007/054070 * 5/2007 | ................. 257/704 |

OTHER PUBLICATIONS

U.S. Appl. No. 12/351,103, filed Jan. 9, 2009, Yamamura.

* cited by examiner

SEMICONDUCTOR DEVICE HAVING HERMITICALLY SEALED ACTIVE AREA AND ELECTRODES

CROSS REFERENCE TO RELATED APPLICATION AND INCORPORATION BY REFERENCE

This application is based upon and claims the benefit of priority from prior Japanese Patent Application No. P2008-013721 filed on Jan. 24, 2008, the entire contents of which are incorporated herein by reference.

BACKGROUND OF THE INVENTION

1. Field of the Invention

The present invention relates to a semiconductor device and a fabrication method of the semiconductor device. In particular, the present invention is relates to a semiconductor device used for millimeter wave power amplifiers, such as GaN based FETs (field effect transistors) and GaAsFETs, and having air-tightness, and a fabrication method of the semiconductor device.

2. Description of the Related Art

A semiconductor device used with a high frequency band, for example, a microwave power amplifying device, is composed of circuit elements such as: active elements, such as a field effect transistor; passive elements, such as a resistor and a capacitor; and micro strip-lines for transmitting high frequency signals.

The above circuit elements are formed, for example, on a semi-insulating substrate. An electrode for grounding is formed in a backside of the semi-insulating substrate. And, when grounding the circuit element provided on the semi-insulating substrate, the electrode for grounding formed on the backside of the semi-insulating substrate is electrically connected with the circuit element through a VIA hole (via hole) which passes through the semi-insulating substrate, for example (for example, refer to Patent Document 1 and Patent Documents 2).

On the other hand, as a method of packaging holding air-tightness applicable in contrast with such the semiconductor device, "MICROSTRUCTURE, SEALING METHOD OF THE MICROSTRUCTURE, MICRO ELECTRIC MACHINE ELEMENT AND FABRICATION METHOD OF THE MICRO ELECTRIC MACHINE ELEMENT, AND ELECTRONIC APPARATUS" are disclosed (for example, refer to Patent Document 3). In the Patent Document 3, the aim is to providing a microstructure and a micro electric machine element which enabled to form an airtight structure easily by using a semiconductor process. An enclosure wall is formed on a substrate so that a body of the micro electric machine element may be surrounded, a top film is bonded to the upper surface of the enclosure wall, and the body of the micro electric machine element is sealed.

Moreover, as a method of packaging holding air-tightness, in an example of a thin film piezoelectric resonator, a filter, and a thin film piezoelectric resonator, "THIN FILM PIEZOELECTRIC RESONATOR, FILTER, AND FABRICATION METHOD OF THE THIN FILM PIEZOELECTRIC RESONATOR" is disclosed (for example, refer to Patent Document 4). In the Patent Document 4, the aim is to providing a thin film piezoelectric resonator which includes a sealing structure which can prevent a collapse of a cavity and can adjust resonance frequency with high precision. The thin film piezoelectric resonator includes: a substrate having a cavity on the surface; a lower electrode extended on the cavity from on a substrate; a piezoelectric film provided on the lower electrode; an upper part electrode which opposes with the lower electrode and is placed on the piezoelectric film, and also is extended on the substrate from on the piezoelectric film; and a sealing member which includes a resonance part inside specified in a region in which the lower electrode and the upper part electrode oppose, is provided on the substrate so that an opening which extends from the cavity may be located outside, and closes the resonance part.

Figure 1:
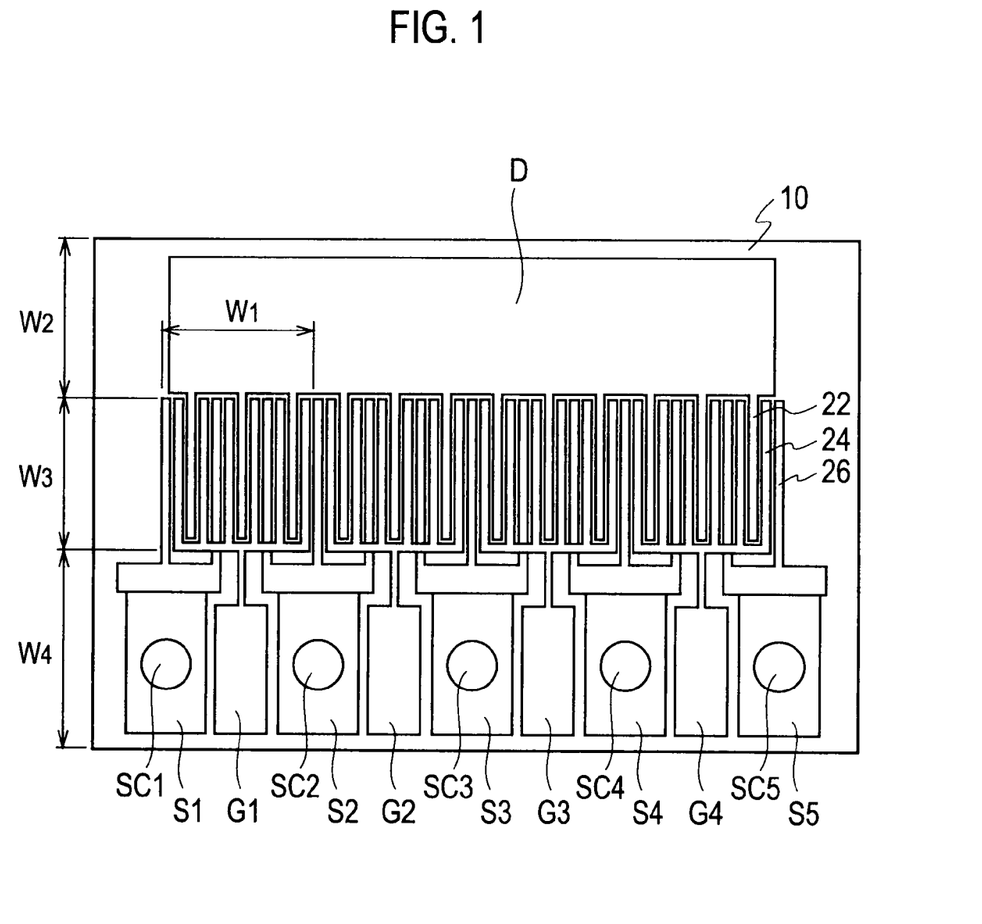
FIG. 1 is a configuration diagram of an overall schematic plane pattern of a semiconductor device according to a conventional example.

FIG. 1 shows a configuration diagram of an overall schematic plane pattern of a semiconductor device according to a conventional example.

As shown in FIG. 1, the overall schematic plane pattern configuration of the semiconductor device according to the conventional example includes: a substrate 10; a gate electrode 24, a source electrode 26, and a drain electrode 22 which are placed on a first surface of the substrate 10 and have a plurality of fingers, respectively; gate terminal electrodes G1, G2, ..., G4, source terminal electrodes S1, S2, ..., S5 and drain terminal electrode D which are placed on the first surface of the substrate 10, governed and formed a plurality of fingers, respectively, every the gate electrode 24, the source electrode 26, and the drain electrode 22.

In a configuration example of FIG. 1, as for the size of each part, for example, cell width W1 is about 120 micrometers, W2 is about 80 micrometers, cell length W3 is about 100 micrometers, W4 is about 120 micrometers, and gate width is about 2.4 mm (=100 micrometer×6×4 cells) as a whole.

In the example of FIG. 1, in the source terminal electrodes S1, S2, ..., S5, VIA holes are formed from a back side of the substrate 10, and a ground conductor is formed on the backside of the substrate 10. And, when grounding the circuit element, the circuit element provided on the substrate 10 and the ground conductor formed on the backside of the substrate 10 are electrically connected through the VIA holes SC1, SC2, ..., SC5 which pass through the substrate 10.

In addition, the gate terminal electrodes G1, G2, ..., G4 are connected to a surrounding semiconductor chip by a bonding wire etc., and the drain terminal electrode D is also connected to a surrounding semiconductor chip by a bonding wire etc.

Figure 2A:
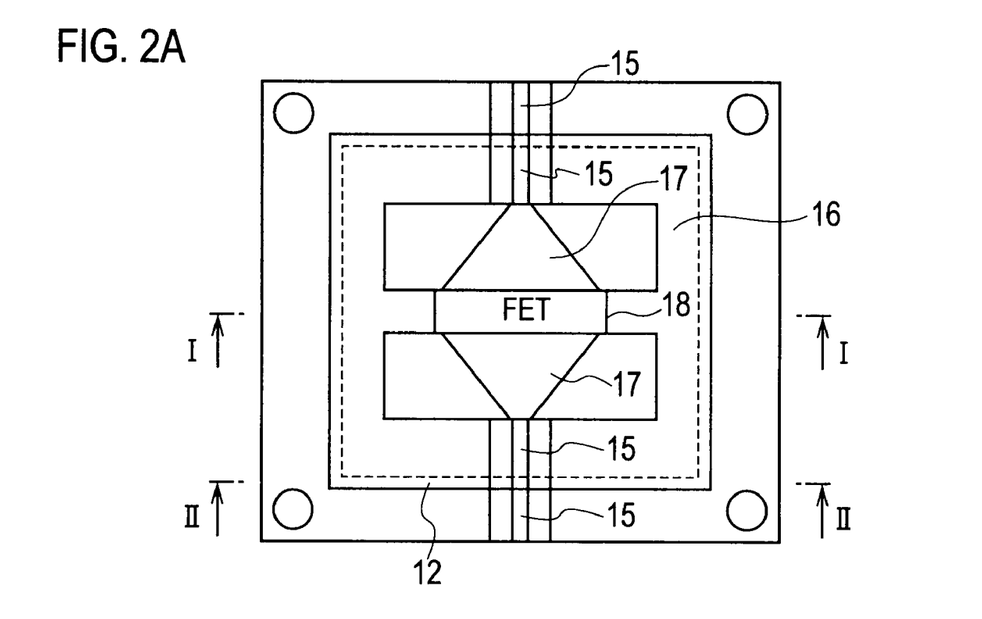
FIG. 2A shows a package configuration of the semiconductor device according to the conventional example, and is a schematic plane pattern configuration diagram.
Figure 2B:
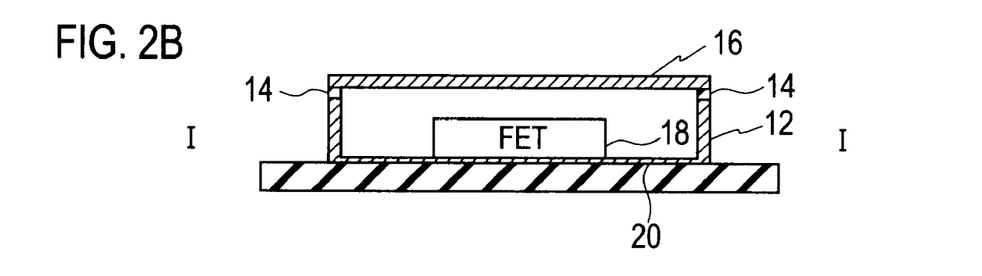
FIG. 2B shows a package configuration of the semiconductor device according to the conventional example, and is a schematic section structure chart taken in the line I-I of FIG. 2A.
Figure 2C:
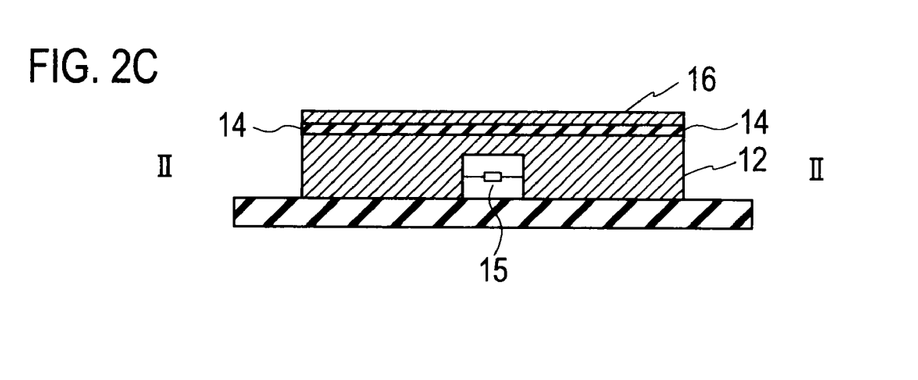
FIG. 2C shows a package configuration of the semiconductor device according to the conventional example, and is a schematic section structure chart taken in the line II-II of FIG. 2A.

FIG. 2A shows a package configuration of the semiconductor device according to the conventional example and is a schematic plane pattern configuration diagram, FIG. 2B shows a schematic section structure chart taken in the line I-I of FIG. 2A, and FIG. 2C shows a schematic section structure chart taken in the line II-II of FIG. 2A, respectively.

As shown, for example in FIG. 2, the package configuration of the semiconductor device according to the conventional example includes: a substrate; a field effect transistor 18 placed on the substrate; input/output matching circuits 17 placed at input/output sections of the field effect transistor 18, respectively; input/output strip-lines 15 connected to the input/output matching circuits 17, respectively; an enclosure wall 12 which includes the field effect transistor 18, the input/output matching circuits 17, and a part of the input/output strip-lines 15; and an upper surface package sealed part 16 placed on the enclosure wall 12 through an adhesive part 14.

In the semiconductor device according to the conventional example, the semiconductor element itself did not have air-tightness but the package which mounts a semiconductor element had air-tightness. Moreover, a high damp-proof dielectric film was deposited on the gate electrode of the semiconductor element.

Patent document 1:
Japanese Patent Application Laying-Open Publication No. H02-288409

Patent document 2:
Japanese Patent Application Laying-Open Publication No. 2001-28425
Patent document 3:
Japanese Patent Application Laying-Open Publication No. 2006-43847
Patent document 4:
Japanese Patent Application Laying-Open Publication No. 2007-36829

The airtight package applied to the semiconductor device of the conventional example is high-cost.

Moreover, the airtight package applied to the conventional semiconductor device had to bond a terminal with the enclosure wall in order to also give air-tightness to a terminal area, therefore had great influence on the high frequency characteristics of the terminal.

On the other hand, although there is also a method of applying resin on the gate electrode in order to give air-tightness to the semiconductor device itself, this method has a problem of increasing gate capacitance and reducing gain of the semiconductor device.

SUMMARY OF THE INVENTION

According to an aspect of the invention, a semiconductor device comprises: a substrate; a gate electrode, a source electrode, and a drain electrode which are placed on a first surface of the substrate and have at least one or more fingers, respectively; a gate terminal electrode, a source terminal electrode, and a drain terminal electrode which are placed on the first surface of the substrate, governed a plurality of fingers, respectively and formed the fingers for every the gate electrode, the source electrode, and the drain electrode; an active area placed on an underneath part of the gate electrode, the source electrode, and the drain electrode, on the substrate between the gate electrode and the source electrodes, and on the substrate between the gate electrode and the drain electrode; a via hole connected to the source terminal electrode; and a sealing layer which is placed on the active area, the gate electrode, the source electrode, and the drain electrode through a cavity part, and performs a hermetic seal of the active area, the gate electrode, the source electrode, and the drain electrode.

According to another aspect of the invention, a fabrication method of a semiconductor device comprises: forming a source electrode, a gate electrode, and a drain electrode on a substrate; forming a sacrifice layer on the source electrode, the gate electrode, and the drain electrode; depositing a sealing layer on the sacrifice layer; forming an opening for removing the sacrifice layer in a part of the sealing layer; removing the sacrifice layer through the opening; and forming a cap sealing layer for sealing the opening on the sealing layer.

According to the present invention, the semiconductor device which can have air-tightness in the semiconductor element itself and does not need to give air-tightness to a package as a result, and the fabrication method of the semiconductor device can be provided.

The semiconductor device according to the embodiments of the invention has the characteristic at a point of giving air-tightness to the semiconductor element itself. More specifically, the fabrication method of the semiconductor device according to the embodiments of the invention has the characteristic at a point of forming a cavity on the semiconductor element part on the semiconductor substrate, and therefore giving air-tightness to the semiconductor element itself.

According to the present invention, since the semiconductor element itself can have air-tightness and it is not necessary to cover the gate electrode surface with the damp-proof protecting film, the value of the gate capacitance of the semiconductor element is reduced, and as a result, the semiconductor device whose high frequency characteristics and gain improve, and the fabrication method of the semiconductor device can be provided.

According to the present invention, the semiconductor element itself can have air-tightness without increasing gate capacitance, and therefore the semiconductor device which is high-reliability in low cost, and the fabrication method of the semiconductor device can be provided.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First Embodiment (Device Structure)

Figure 3:
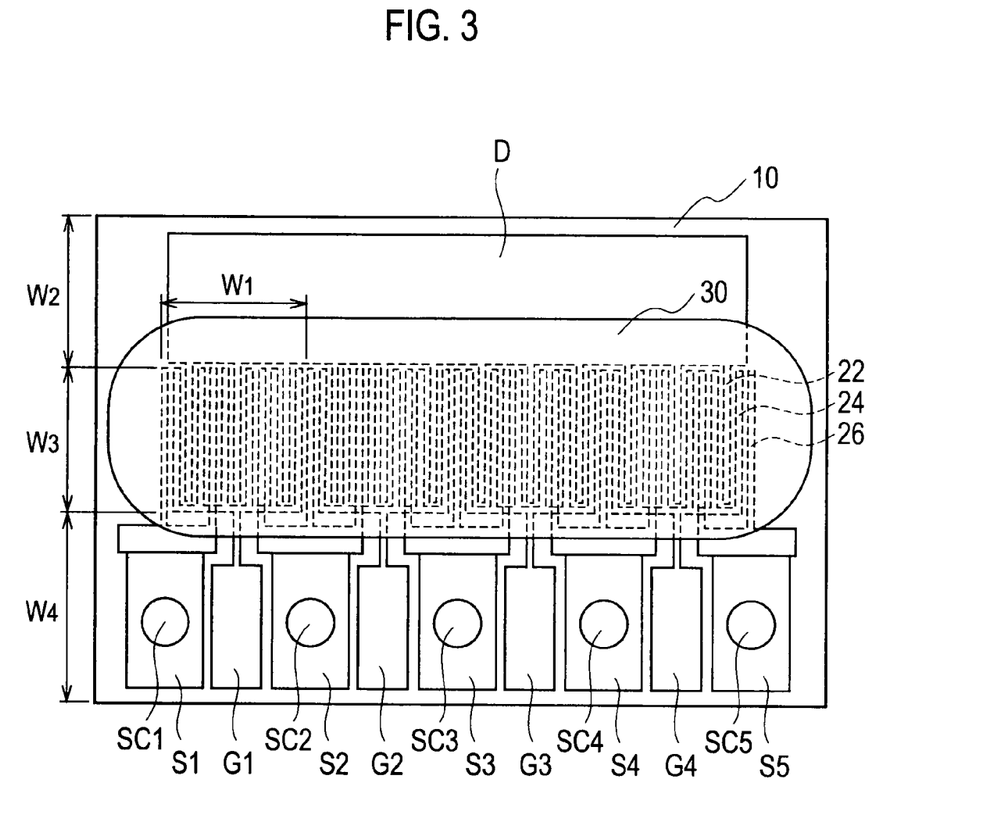
FIG. 3 is a configuration diagram of a schematic plane pattern of a semiconductor device according to a first embodiment of the present invention.

As shown in FIG. 3, a semiconductor device according to a first embodiment of the present invention includes: a substrate 10; a gate electrode 24, a source electrode 26, and a drain electrode 22 which are placed on a first surface of the substrate 10 and have at least one or more fingers, respectively; gate terminal electrodes G1 to G4, source terminal electrodes S1 to S4, and a drain terminal electrode D which are placed on the first surface of the substrate 10, governs a plurality of fingers, respectively and forms the fingers every the gate electrode 24, the source electrode 26, and the drain electrode 22; an active area placed underneath parts of the gate electrode 24, the source electrode 26, and the drain electrode 22, between the gate electrode 24 and the source electrodes 26 and between the gate electrode 24 and the drain electrode 22 on the substrate 10; VIA holes SC1 to SC5 connected to the source terminal electrodes S1 to S5, respectively; and a sealing layer 30 which is placed on the active area, the gate electrode 24, the source electrode 26, and the drain electrode 22 through a cavity part and performs the hermetic seal of the active area, the gate electrode 24, the source electrode 26, and the drain electrode 22.

In a configuration example of FIG. 3, as for the size of each part, for example, cell width W1 is about 120 micrometers, W2 is about 80 micrometers, cell length W3 is about 100 micrometers, W4 is about 120 micrometers, and gate width is about 2.4 mm (=100 micrometer×6×4 cells) as a whole.

A Si substrate, a GaAs substrate, a SiGe substrate, an InP substrate, a SiC substrate, a GaN substrate, a substrate on which a GaN epitaxial layer is formed on a SiC substrate, a substrate on which a hetero-junction epitaxial layer composed of GaN/GaAlN is formed on a SiC substrate, a sapphire substrate, or a diamond substrate may be applicable to the substrate 10.

As shown, for example in FIG. 4, a package configuration of the semiconductor device according to the first embodiment of the present invention includes: a substrate; a field effect transistor 18 placed on the substrate; output matching circuits 17 placed at input/output sections of the field effect transistor 18, respectively; input/output strip-lines 15 connected to the input/output matching circuits 17, respectively; an enclosure wall 12 which includes the field effect transistor 18, the input/output matching circuits 17, and a part of the input/output strip-lines 15; and an upper surface package sealed part 16 placed on the enclosure wall 12 through an adhesive part 14.

In the semiconductor device according to the first embodiment of the present invention, as shown in FIG. 3, since air-tightness is given to the semiconductor element itself by the sealing layer 30 placed on the semiconductor element through the cavity part, it is not necessary to give air-tightness to the package for mounting the semiconductor element. For this reason, package cost can be reduced.

Figure 4A:
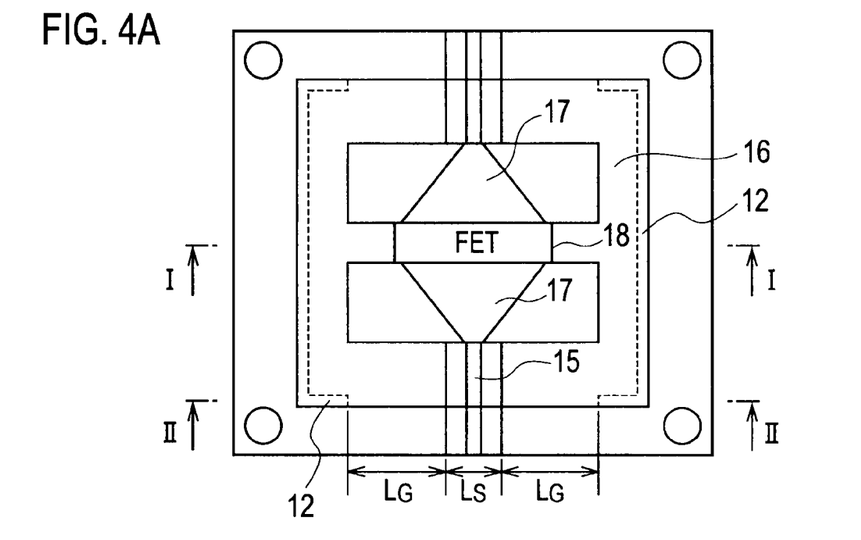
FIG. 4A shows a package configuration of the semiconductor device according to the first embodiment of the present invention, and is a schematic plane pattern configuration diagram.
Figure 4B:
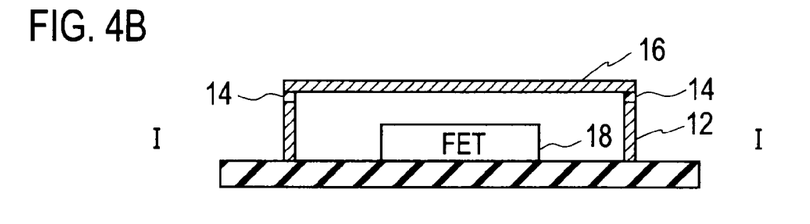
FIG. 4B shows a package configuration of the semiconductor device according to the first embodiment of the present invention, and is a schematic section structure chart taken in the line I-I of FIG. 4A.
Figure 4C:
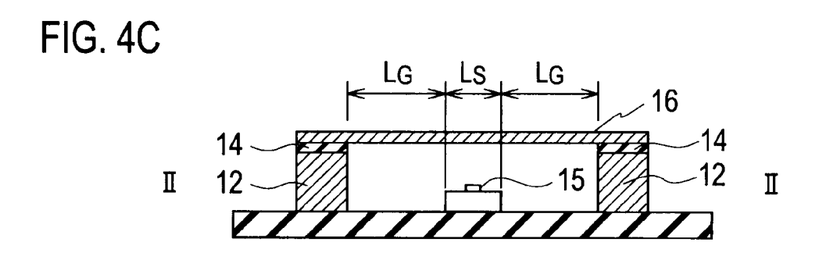
FIG. 4C shows a package configuration of the semiconductor device according to the first embodiment of the present invention, and is a schematic section structure chart taken in the line II-II of FIG. 4A.
Figure 4D:
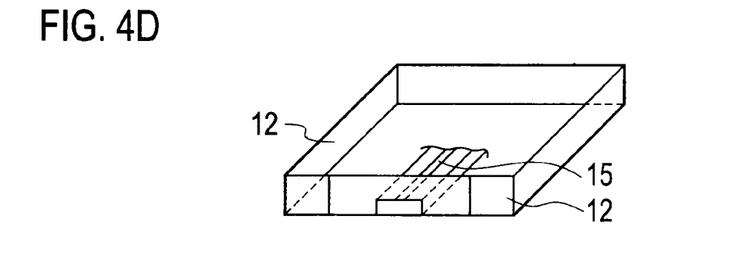
FIG. 4D shows a package configuration of the semiconductor device according to the first embodiment of the present invention, and is a schematic bird's-eye view of an enclosure wall.

As schematically shown in FIG. 4C and FIG. 4D, the enclosure wall 12 is provided with sufficient aperture width ($2 \times L_G + L_S$), near the input/output strip-lines 15, as shown by mounting width $L_S$ of the input/output strip-lines 15, and aperture width $L_G$ between the input/output strip-lines 15 and the enclosure wall 12. As a size of aperture width ($2 \times L_G + L_S$), it is about 10 mm in the frequency of about 14 GHz.

Figure 5:
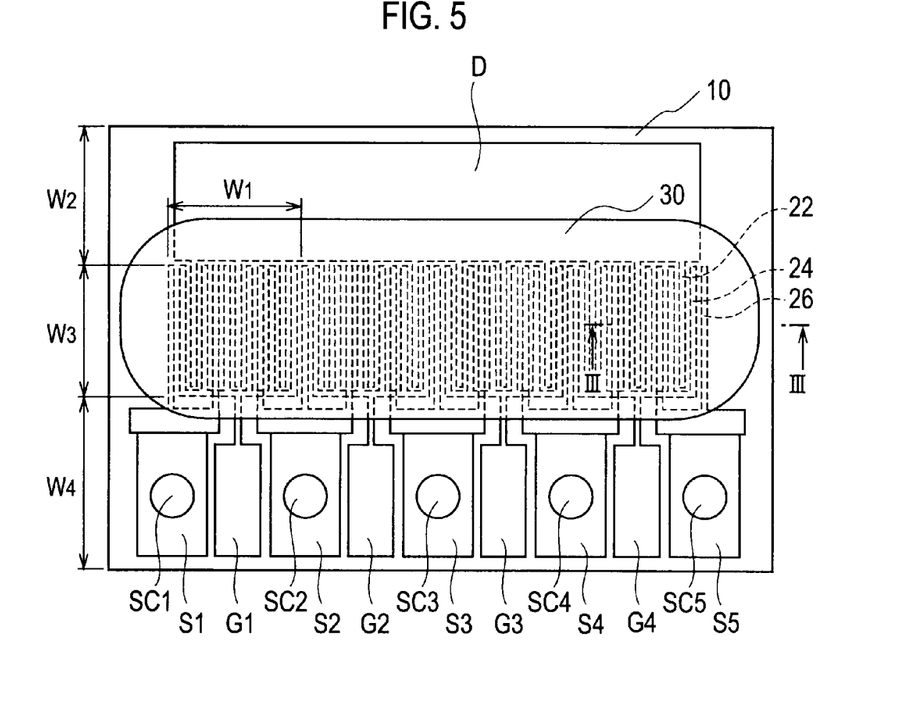
FIG. 5 is an explanatory diagram of a drain electrode 22, a gate electrode 24, a source electrode 26, and a line III-III, in the configuration diagram of the schematic plane pattern of the semiconductor device according to the first embodiment of the present invention.
Figure 6:
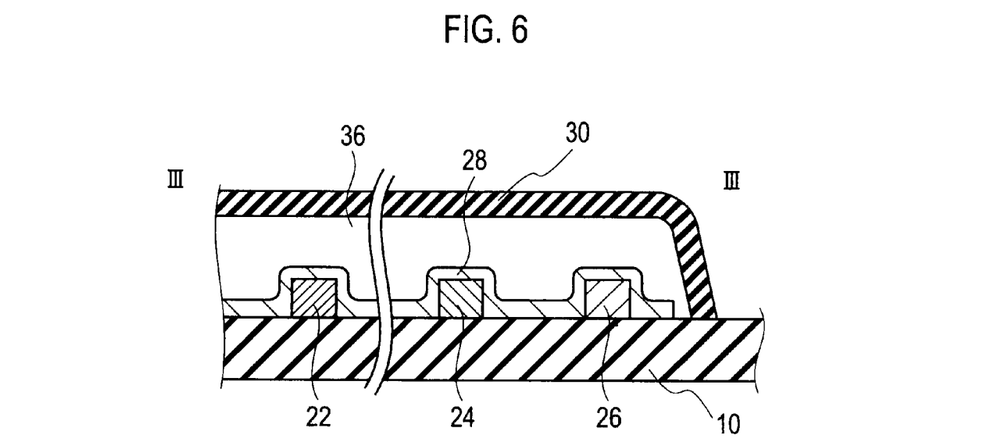
FIG. 6 is a schematic section structure chart taken in the line III-III of FIG. 5.

As shown in FIG. 5 and FIG. 6, the semiconductor device according to the first embodiment of the present invention may include a first insulating film 28 on the gate electrode 24, the source electrode 26, and the drain electrode 22, on the substrate 10 between the gate electrode 24 and the drain electrode 22, and on the substrate 10 between the gate electrode 24 and the source electrode 26. As the first insulating film 28, a nitride film ($Si_xN_y$ film), a silicon dioxide film ($SiO_2$ film), a silicon oxy-nitride film (SiON film), etc. are applicable, for example.

When using a GaAs substrate or a GaN substrate as the substrate 10, since dangling bonds are formed on the surface of the substrate, there is an advantage that such the dangling bonds can be inactivated by performing a termination with nitrogen atoms of the $Si_xN_y$ film. Thickness in a case of using the $Si_xN_y$ film as the first insulating film 28 is, for example, about 40 nm to about 200 nm.

These first insulating films 28 are formed with sufficient adhesion on the gate electrode 24, on the substrate 10 between the gate electrode 24 and the drain electrode 22, and on the substrate 10 between the gate electrode 24 and the source electrode 26.

Figure 10:
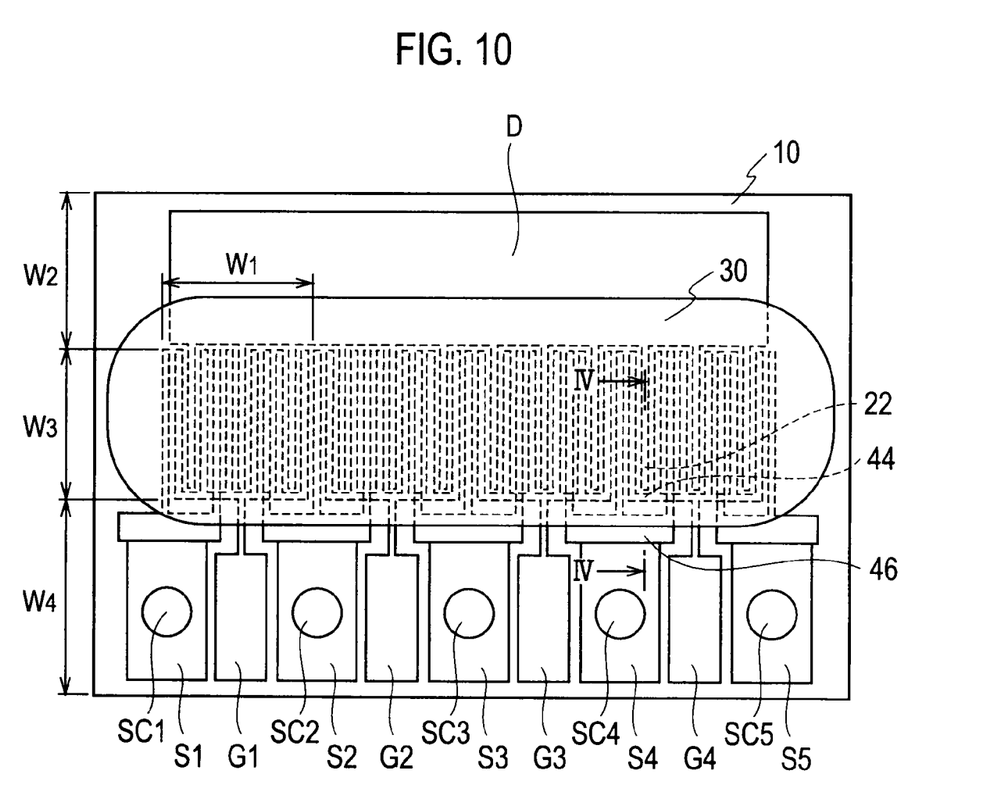
FIG. 10 is an explanatory diagram of a drain electrode 22, a gate bus line 44, a source bus line 46, and a line IV-IV, in the configuration diagram of the schematic plane pattern of the semiconductor device according to the first embodiment of the present invention.

As shown in FIG. 10, in the semiconductor device according to the first embodiment of the present invention, the source terminal electrodes S1 to S5, the gate terminal electrodes G1 to G4, and the drain terminal electrode D which are extracted from the source electrode 26, the gate electrode 24, and the drain electrode 22, respectively, which are placed in the cavity part 36 by the sealing layer 30, are placed to external of the sealing layer 30.

Or, in the semiconductor device according to the first embodiment of the present invention, the gate terminal electrodes G1 to G4 and the drain terminal electrode D, which are extracted, respectively from the gate electrode 24 and the drain electrode 22 which are placed in the cavity part 36 by the sealing layer 30, may be placed to external of the sealing layer 30. That is, in the plane pattern configuration of FIG. 10, a part of source terminal electrodes SI to S5 may be placed in the cavity part 36 surrounded by the sealing layer 30. Furthermore, in the plane pattern configuration of FIG. 10, the whole of the source terminal electrodes S1 to S5 may be placed in the cavity part 36 surrounded by the sealing layer 30.

Only the gate terminal electrodes G1 to G4 and the drain terminal electrode D are placed to external of the sealing layer 30 by such the plane pattern configuration.

Figure 12:
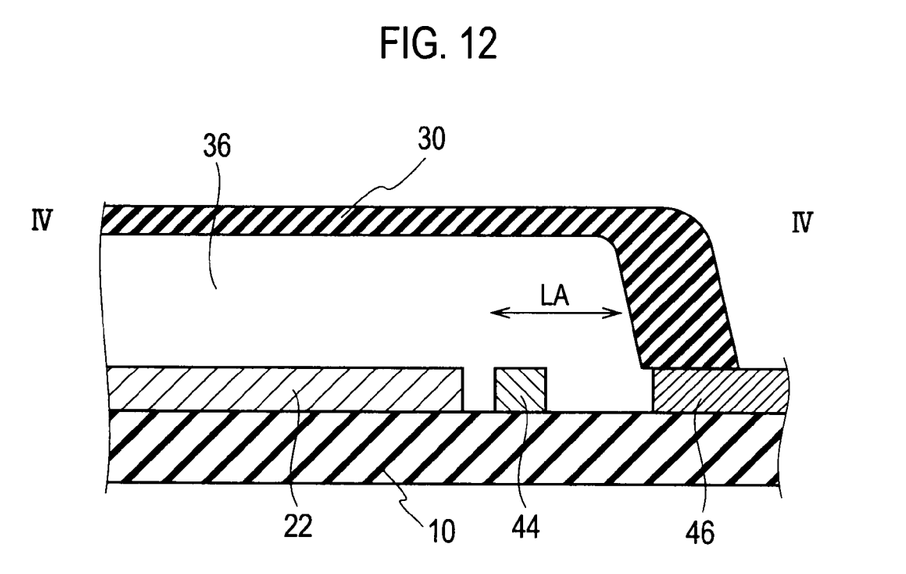
FIG. 12 is a schematic section structure chart taken in the line IV-IV of FIG. 10, in a semiconductor device according to the first embodiment of the present invention.

As shown in FIG. 12, the semiconductor device according to the first embodiment of the present invention, it may place so that distance LA between the gate bus line 44 which is placed adjoining the drain electrode 22 placed in the cavity part 36 by the sealing layer 30, and an internal wall of the sealing layer 30 placed on the source bus line 46 (S4) may have a predetermined size (for example, about 20 micrometers).

Figure 11:
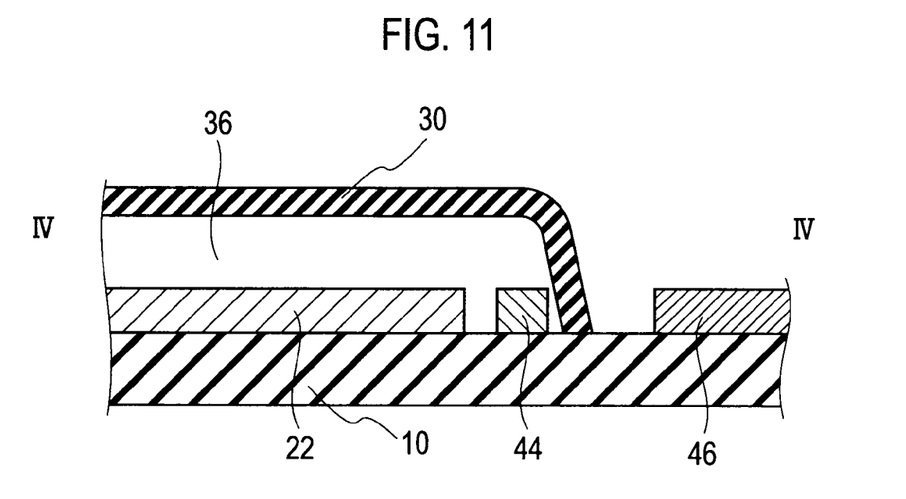
FIG. 11 is a schematic section structure chart taken in the line IV-IV of FIG. 10, in a semiconductor device according to a comparative example of the present invention.

In a cross-sectional configuration of a comparative example shown in FIG. 11, since a junction area of the sealing layer 30 and the substrate 10 is small, a junction margin between the sealing layer 30 and the substrate 10 is small. On the other hand, in the semiconductor device according to the first embodiment of the present invention, as shown in FIG. 12, since the sealing layer 30 is placed on the source bus line 46 (S4), a margin can be reserved to accuracy of position of the sealing layer 30. Moreover, since a large junction area of the sealing layer 30 and the semiconductor element can be reserved, air-tightness can be more improved.

Figure 13:
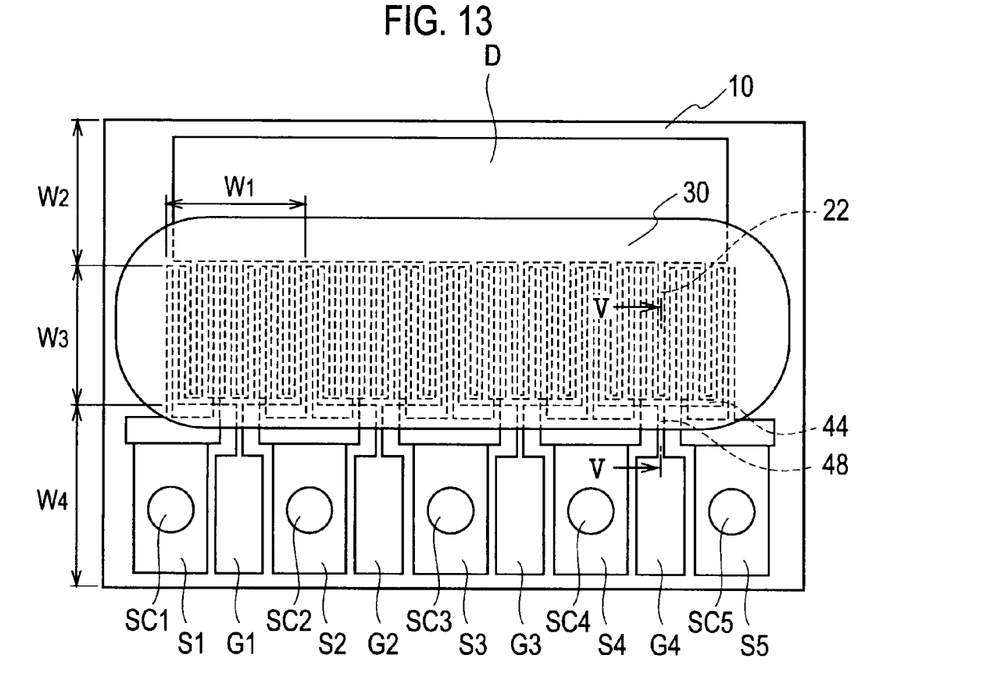
FIG. 13 is an explanatory diagram of a drain electrode 22, a gate bus line 44, a gate leader line 48, and a line V-V, in the configuration diagram of the schematic plane pattern of the semiconductor device according to the first embodiment of the present invention.
Figure 14:
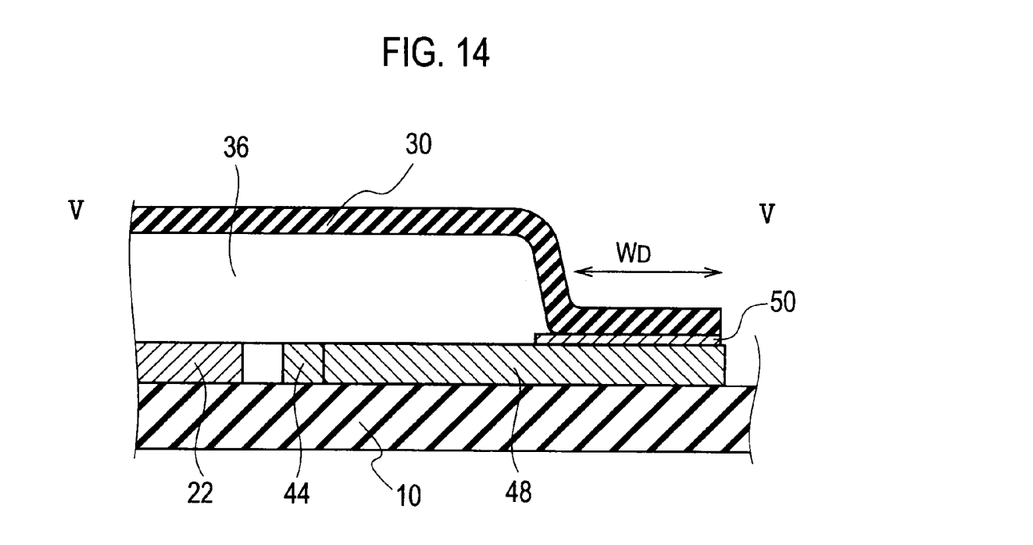
FIG. 14 is a schematic section structure chart taken in the line V-V of FIG. 13, in a semiconductor device according to the first embodiment of the present invention.

In the semiconductor device according to the first embodiment of the present invention, as shown in FIG. 13 and FIG. 14, a gate lead-out wiring 48 which connects the gate terminal electrodes G1 to G4 and the gate electrode 24 bonds, for example, not less than about 20 micrometers with the sealing layer 30.

In the semiconductor device according to the first embodiment of the present invention, as shown in FIG. 13 and FIG. 14, the sealing layers 30 placed on the gate lead-out wiring 48 of the same layer as the gate bus line 44 which is placed adjoining the drain electrode 22 placed in the cavity part 36 by the sealing layer 30 is bonded, for example, not less than about 20 micrometers. In addition, in order to adhere the gate lead-out wiring 48 and the sealing layer 30, an adhesive layer 50 formed, for example, from a Ti layer etc. may be disposed between the gate lead-out wiring 48 and the sealing layer 30.

Modified Example 1 of the First Embodiment

Figure 7:
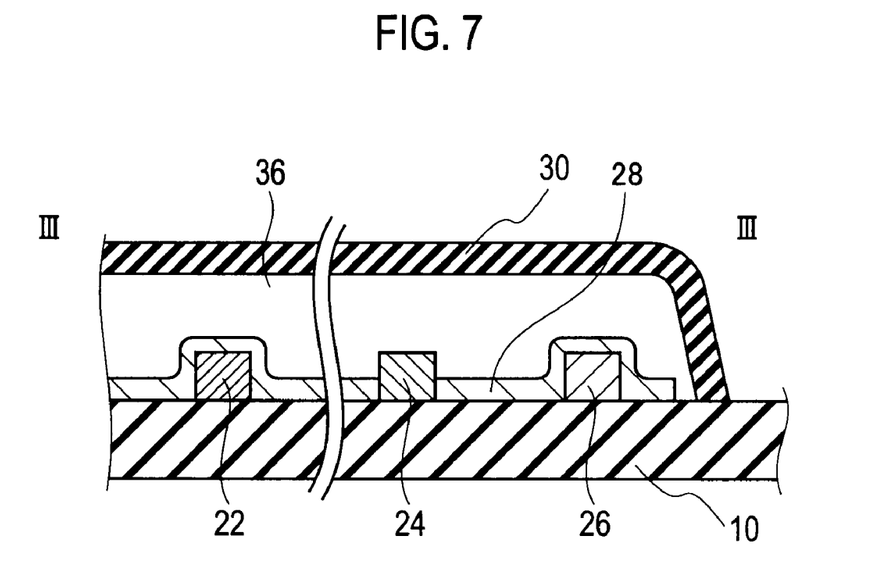
FIG. 7 is a schematic section structure chart taken in the line III-III of FIG. 5, in a semiconductor device according to the modified example 1 of the first embodiment of the present invention.

As shown in FIG. 7, a semiconductor device related to a modified example 1 of the first embodiment of the present invention includes a first insulating film 28 on the source electrode 26 and the drain electrode 22, on the substrate 10 between the gate electrode 24 and the drain electrode 22, and on the substrate 10 between the gate electrode 24 and the source electrode 26. As the first insulating film 28, for example, a $Si_xN_y$ film, a $SiO_2$ film, a SiON film, etc. are applicable.

These fist insulating films 28 are formed with sufficient adhesion on the source electrode 26 and the drain electrode 22, on the substrate 10 between the gate electrode 24 and the source electrode 26, and on the substrate 10 between the gate electrode 24 and the drain electrode 22.

In the semiconductor device according to the modified example 1 of the first embodiment of the present invention, since the first insulating film 28 is not placed on the gate electrode 24 as shown in FIG. 7, the value of the gate capacitance is relatively reduced compared with the value of the gate capacitance of the semiconductor device according to the first embodiment.

Modified Example 2 of the First Embodiment

Figure 8:
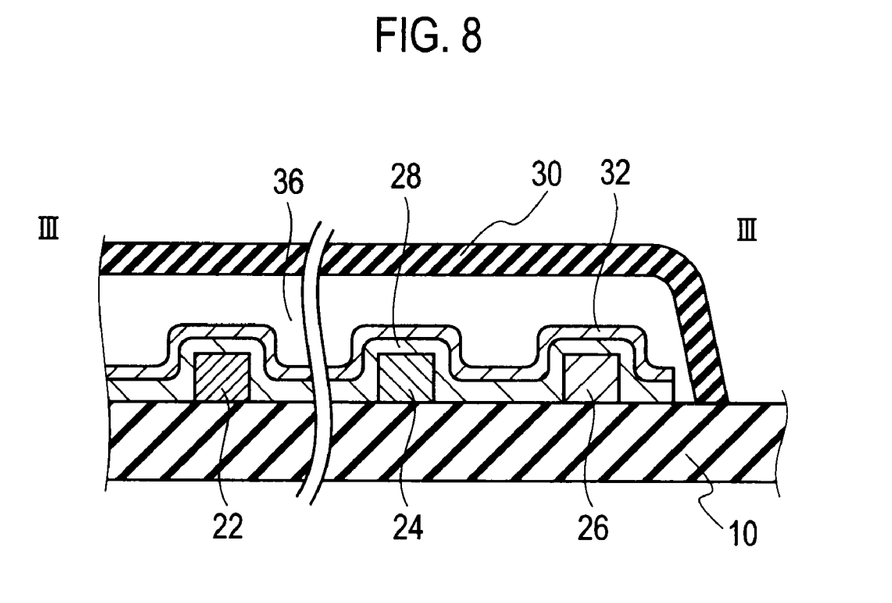
FIG. 8 is a schematic section structure chart taken in the line III-III of FIG. 5, in a semiconductor device according to the modified example 2 of the first embodiment of the present invention.

As shown in FIG. 8, a semiconductor device according to a modified example 2 of the first embodiment of the present invention includes: a first insulating film 28 on the gate electrode 24, the source electrode 26 and the drain electrode 22, on the substrate 10 between the gate electrode 24 and the drain electrode 22, and on the substrate 10 between the gate electrode 24 and the source electrode 26; and a second insulating film 32 on the first insulating film 28.

As the first insulating film 28, for example, a $Si_xN_y$ film, a $SiO_2$ film, a SiON film, etc. are applicable. As the second insulating film 32, for example, a $SiO_2$ film, a SiON film, etc. are applicable.

Thickness in a case of using a nitride film as the first insulating film 28 is, for example, about 40 nm to about 200 nm. Moreover, thickness in a case of using the $SiO_2$ film as the second insulating film 32 is, for example, about 100 nm to about 400 nm. Or, thickness of $SiO_2$ film used as the second insulating film 32, for example, may be not less than about 400 nm.

These fist insulating films 28 and second insulating films 32 are formed with sufficient adhesion on the gate electrode 24, the source electrode 26 and the drain electrode 22, on the substrate 10 between the gate electrode 24 and the source electrode 26, and on the substrate 10 between the gate electrode 24 and the drain electrode 22.

Modified Example 3 of the First Embodiment

Figure 9:
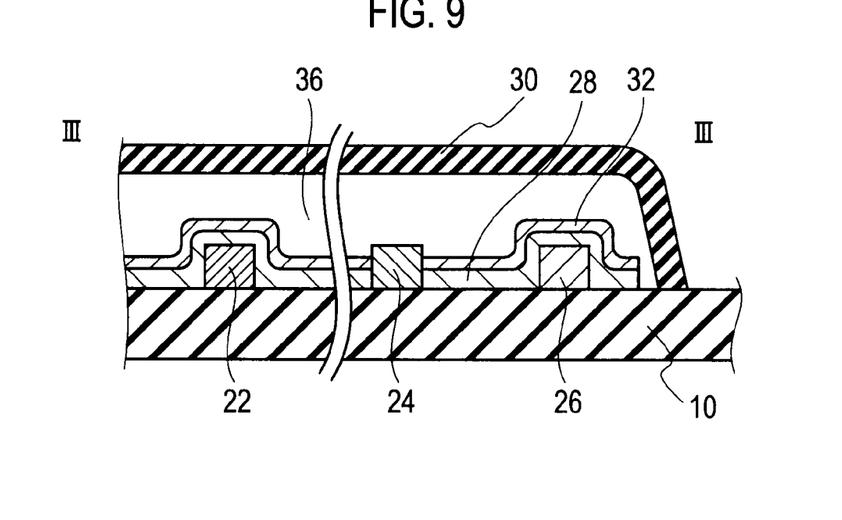
FIG. 9 is a schematic section structure chart taken in the line III-III of FIG. 5, in a semiconductor device according to the modified example 3 of the first embodiment of the present invention.

As shown in FIG. 9, a semiconductor device related to a modified example 3 of the first embodiment of the present invention includes: a first insulating film 28 on the source electrode 26 and the drain electrode 22, on the substrate 10 between the gate electrode 24 and the drain electrode 22, and on the substrate 10 between the gate electrode 24 and the source electrode 26; and a second insulating film 32 on the first insulating film 28.

As the first insulating film 28, for example, a $Si_xN_y$ film, a $SiO_2$ film, a SiON film, etc. are applicable. As the second insulating film 32, for example, a $SiO_2$ film, a SiON film, etc. are applicable.

These fist insulating films 28 and the second insulating film 32 are formed with sufficient adhesion on the source electrode 26 and the drain electrode 22, on the substrate 10 between the gate electrode 24 and the source electrode 26, and on the substrate 10 between the gate electrode 24 and the drain electrode 22.

In the semiconductor device according to the modified example 3 of the first embodiment of the present invention, since the first insulating film 28 and the second insulating film 32 are not placed on the gate electrode 24 as shown in FIG. 9, the value of the gate capacitance is reduced compared with the value of the gate capacitance of the semiconductor device according to the first embodiment and the semiconductor device according to the modified example 2 of the first embodiment.

(Fabrication Method)

As shown in FIG. 15, a fabrication method of the semiconductor device according to the first embodiment of the present invention includes: forming the source electrode 26, the gate electrode 24, and the drain electrode 22 on the substrate 10; forming the sacrifice layer 34 covering the source electrode 26, the gate electrode 24, and the drain electrode 22; depositing the sealing layer 30 covering the sacrifice layer 34; forming an opening in a part of sealing layer 30 for removing the sacrifice layer 34; removing the sacrifice layer 34 through the opening; and forming a cap sealing layer 38 on the sealing layer 30 for sealing the opening.

Moreover, the fabrication method of the semiconductor device according to the first embodiment of the present invention may include forming the first insulating film 28 on the gate electrode 24, the source electrode 26, and the drain electrode 22, on the substrate 10 between the gate electrode 24 and the drain electrode 22, and on the substrate 10 between the gate electrode 24 and the source electrode 26.

Moreover, the fabrication method of the semiconductor device according to the first embodiment of the present invention may include forming the first insulating film 28 on the source electrode 26 and the drain electrode 22, on the substrate 10 between the gate electrode 24 and the drain electrode 22, and on the substrate 10 between the gate electrode 24 and the source electrode 26.

Moreover, the fabrication method of the semiconductor device according to the first embodiment of the present invention may include forming the second insulating film 32 on the first insulating film 28.

Moreover, the first insulating film 28 may be formed with a nitride film.

Moreover, the second insulating film 32 may be formed with a silicon dioxide film.

Hereinafter, with reference to FIG. 15, the fabrication method of the semiconductor device according to the first embodiment of the present invention will be explained in detail.

Figure 15A:
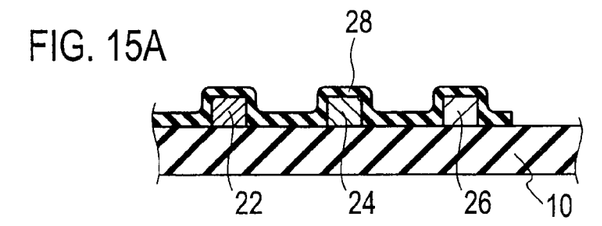
FIG. 15A shows a fabrication method of the semiconductor device according to the first embodiment of the present invention, and is a process chart showing forming a first insulating film 28 on a drain electrode 22, a gate electrode 24, and a source electrode 26.

(a) First of all, as shown in FIG. 15A, form the first insulating film 28 after forming the drain electrode 22, the gate electrode 24, and the source electrode 26 on the substrate 10. For example, Ti/Al can be applied as the source electrode 26 and the drain electrode 22, and, for example, Ni/Al can be applied as the gate electrode 24. Moreover, as the first insulating film 28, a $Si_xN_y$ film, a $SiO_2$ film, a SiON film, etc. are applicable, as above-mentioned. The nitride film about 80 nm thick is used for an example of FIG. 15A. Moreover, as the substrate 10, a Si substrate, a GaAs substrate, a SiGe substrate, an InP substrate, a SiC substrate, a GaN substrate, a substrate on which a GaN epitaxial layer is formed on a SiC substrate, a substrate on which a heterojunction epitaxial layer composed of GaN/GaAlN is formed on a SiC substrate, a sapphire substrate, or a diamond substrate may be applicable. In addition, although a desired active area of semiconductor element is formed on the substrate 10 by MOCVD (Metal Organic Chemical Vapor Deposition), MBE (Molecular Beam Epitaxy), etc., detailed description is omitted.

Figure 15B:
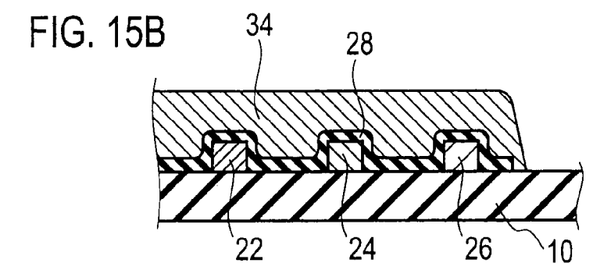
FIG. 15B shows a fabrication method of the semiconductor device according to the first embodiment of the present invention, and is a process chart showing forming a sacrifice layer 34 on a first insulating film 28.

(b) Next, as shown in FIG. 15B, form the sacrifice layer 34 so that the first insulating film 28 may be covered. As a material for the sacrifice layer 34, photosensitive polyimide resin etc. are applicable, for example. The value of the thickness of the sacrifice layer 34 composed of the used photosensitive polyimide resin is about 5 to 10 micrometers.

Figure 15C:
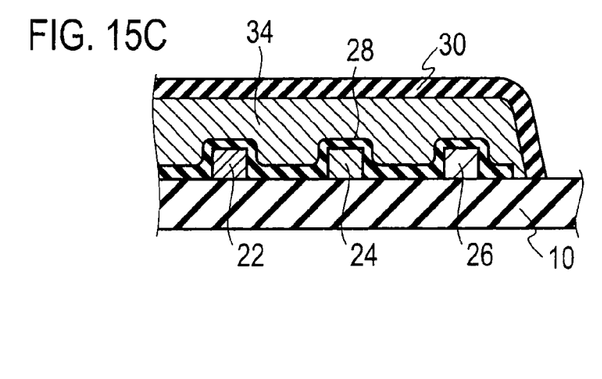
FIG. 15C shows a fabrication method of the semiconductor device according to the first embodiment of the present invention, and is a process chart showing forming a sealing layer 30 on the sacrifice layer 34.

(c) Next, as shown in FIG. 15C, form the sealing layer 30 so that the sacrifice layer 34 may be covered. As a material of the sealing layer 30, for example, epoxy system heat curing resin whose thickness is about 1 micrometer or, a silicon dioxide film or a nitride film etc. whose thickness is about 1 micrometer is applicable.

Figure 15D:
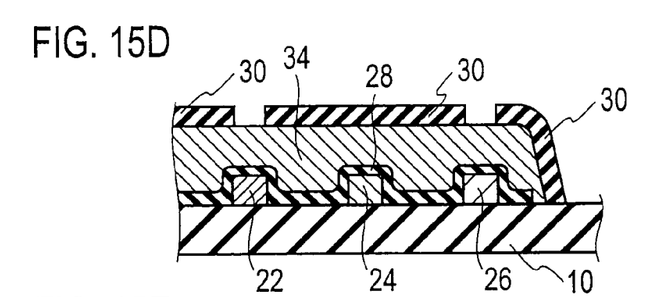
FIG. 15D shows a fabrication method of the semiconductor device according to the first embodiment of the present invention, and is a process chart showing performing window opening to the sealing layer 30.

(d) Next, as shown in FIG. 15D, form an opening whose width is about 5 to 20 micrometers in the sealing layer 30. The placement of an opening, for example, may be at about 10 micrometers in width, and may be formed in a predetermined pitch of about 30 micrometers or may completely be formed at random.

Figure 15E:
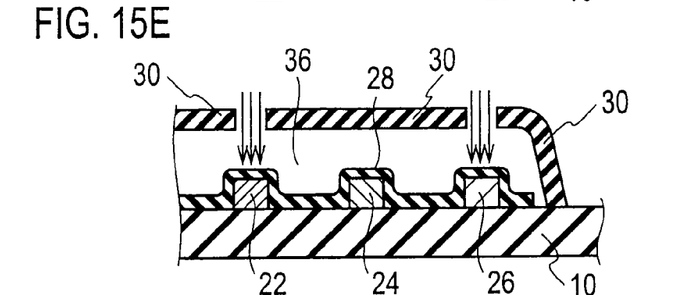
FIG. 15E shows a fabrication method of the semiconductor device according to the first embodiment of the present invention, and is a process chart showing removing the sacrifice layer 34 by plasma etching to form a cavity part 36.

(e) Next, as shown in FIG. 15E, remove the sacrifice layer 34 by etching through an oxygen plasma asher via the opening formed by the above-mentioned process, and then form the cavity part 36. In this process, in order to avoid damaging by plasma etching, the second insulating film 32 composed of silicon dioxide film etc. may be formed on the first insulating film 28 as shown in FIG. 8.

Figure 15F:
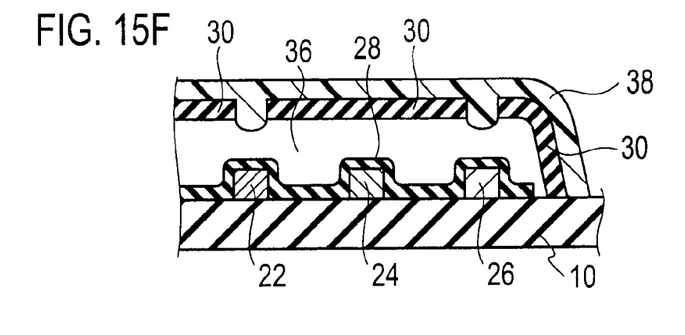
FIG. 15F shows a fabrication method of the semiconductor device according to the first embodiment of the present invention, and is a process chart showing forming a cap sealing layer 38 on the sealing layer 30 to seal the cavity part 36.

(f) Next, as shown in FIG. 15F, form the cap sealing layer 38 on the sealing layer 30 so as to be filled up with the opening, and then seal the cavity part 36 with sufficient air-tightness. As a material of the cap sealing layer 38, organic polymer resin, a $SiO_2$ film, a $Si_xN_y$ film, etc. are applicable.

According to the present invention, the semiconductor device which can have air-tightness in the semiconductor element itself and does not need to give air-tightness to a package as a result, and the fabrication method of the semiconductor device can be provided.

According to the present invention, since the semiconductor element itself can have air-tightness and it is not necessary to cover the gate electrode surface with the damp-proof protective film, the value of the gate capacitance of the semiconductor element is reduced, and as a result, the semiconductor device whose high frequency characteristics and gain improve, and the fabrication method of the semiconductor device can be provided.

According to the present invention, the semiconductor element itself can have air-tightness without increasing the value of the gate capacitance, and therefore the semiconductor device which is high-reliability in low cost, and the fabrication method of the semiconductor device can be provided

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the amplifying elements are applicable not only to FET but also other amplifying elements, such as HEMT (High Electron Mobility Transistor), LDMOS FET (Lateral Doped Metal-Oxide-Semiconductor Field Effect Transistor), and HBT (Heterojunction Bipolar Transistor).

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

INDUSTRIAL APPLICABILITY

According to the present invention, the semiconductor device is applied for a semiconductor device having a wide range of application fields, such as an internally matched power amplifier, a power MMIC (Monolithic Microwave Integrated Circuit), a microwave power amplifier, and a millimeter-wave power amplifier.

What is claimed is:

1. A semiconductor device comprising:
   a substrate;
   a gate electrode, a source electrode, and a drain electrode which are placed on a first surface of the substrate and have at least one or more fingers, respectively;
   a gate terminal electrode, a source terminal electrode, and a drain terminal electrode which are placed on the first surface of the substrate, governs or joined with a plurality of respective electrode fingers;
   an active area placed on an underneath part of the gate electrode, the source electrode, and the drain electrode, on the substrate between the gate electrode and the source electrodes, and on the substrate between the gate electrode and the drain electrode;
   a via hole connected to the source terminal electrode, respectively;
   a sealing layer which is placed above and separated vertically from any one of the active area, the gate electrode, the source electrode, and the drain electrode through a cavity part, and performs a hermetic seal of the active area, the gate electrode, the source electrode, and the drain electrode; and
   a first insulating film placed on the source electrode and the drain electrode, on the substrate between the gate electrode and the drain electrode, and on the substrate between the gate electrode and the source electrode.

2. The semiconductor device according to claim 1, comprising:
   a source terminal electrode, a gate terminal electrode, and a drain terminal electrode extracted, respectively from the source electrode, the gate electrode, and the drain electrode which are placed in the cavity part by the sealing layer, wherein the source terminal electrode, the gate terminal electrode, and the drain terminal electrode are placed external to the sealing layer.

3. The semiconductor device according to claim 1, comprising:
   a gate terminal electrode and a drain terminal electrode extracted, respectively from the gate electrode and the drain electrode which are placed in the cavity part by the sealing layer, wherein the gate terminal electrode and the drain terminal electrode are placed external to the sealing layer.

4. The semiconductor device according to claim 1, wherein the substrate is selected from a group consisting of a Si substrate, a GaAs substrate, a SiGe substrate, an InP substrate, a SiC substrate, a GaN substrate, a substrate on which a GaN epitaxial layer is formed on a SiC substrate, a substrate on which a heterojunction epitaxial layer composed of GaN/GaAlN is formed on a SiC substrate, a sapphire substrate, and a diamond substrate.

5. The semiconductor device according to claim 1, further comprising
   a second insulating film placed on the first insulating film.

6. The semiconductor device according to claim 1, wherein the first insulating film is a nitride film.

7. The semiconductor device according to claim 5, wherein the second insulating film is a silicon dioxide film.

8. The semiconductor device according to claim 2, comprising:
   a gate lead-out wiring which connects the gate terminal electrode and the gate electrode and which bonds not less than 20 micrometers with the sealing layer.

* * * * *